US006544821B2

(12) United States Patent
Akram

(10) Patent No.: US 6,544,821 B2
(45) **Date of Patent: *Apr. 8, 2003**

(54) STEREOLITHOGRAPHIC METHODS OF FABRICATING SEMICONDUCTOR DEVICES HAVING PROTECTIVE LAYERS THEREON THROUGH WHICH CONTACT PADS ARE EXPOSED

(75) Inventor: Salman Akram, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/882,754

(22) Filed: Jun. 15, 2001

(65) Prior Publication Data

US 2001/0051392 A1 Dec. 13, 2001

Related U.S. Application Data

(63) Continuation of application No. 09/590,412, filed on Jun. 8, 2000, now Pat. No. 6,326,698.

(51) Int. Cl.[7] ........................ H01L 21/44; H01L 21/48; H01L 21/50

(52) U.S. Cl. ...................... 438/127; 438/106; 438/108; 438/110; 438/112; 438/121; 438/124; 438/778; 438/780; 438/781

(58) Field of Search ................................ 438/106, 108, 438/110, 112, 121, 124, 127, 778, 780, 781

(56) References Cited

U.S. PATENT DOCUMENTS 4,273,859 A 6/1981 Mones et al.
5,173,220 A 12/1992 Reiff et al.
5,264,061 A 11/1993 Juskey et al.
5,484,314 A 1/1996 Farnworth
5,705,117 A 1/1998 O'Connor et al.
5,773,198 A 6/1998 Swirbel et al.
5,839,722 A 11/1998 Berlin et al.
6,013,419 A 1/2000 Tani et al.
6,177,360 B1 1/2001 Carter et al.
6,197,397 B1 3/2001 Sher et al.
6,200,646 B1 3/2001 Neckers et al.
6,203,885 B1 3/2001 Sher et al.
6,326,698 B1 * 12/2001 Akram ...................... 257/781

FOREIGN PATENT DOCUMENTS

| | | |
|---|---|---|
| EP | 0006052 | 12/1979 |
| JP | 9-17783 | 1/1997 |
| JP | 9-36115 | 2/1997 |
| JP | 9-64537 | 3/1997 |

* cited by examiner

*Primary Examiner*—David L. Talbott
*Assistant Examiner*—David A. Zarneke
(74) *Attorney, Agent, or Firm*—TraskBritt

(57) ABSTRACT

A method for forming packaged substrates, including flip-chip dice individually or in a multi-die wafer. The method includes using a stereolithographic process to form a protective dielectric polymeric sealing structure on at least the active surface of the substrate. In addition, the invention encompasses forming a similar layer on a second substrate to be joined to the first substrate. Contact pads of the second substrate are exposed through the layer thereon to facilitate joining of the two substrates. Semiconductor devices formed by the method are also disclosed.

40 Claims, 5 Drawing Sheets

60
30
32
34
28
18
14
12
22
16
56
18
14
30E
30D
25
30A
56
30F
30G
24
52
52B
52A
30C
30B

STEREOLITHOGRAPHIC METHODS OF FABRICATING SEMICONDUCTOR DEVICES HAVING PROTECTIVE LAYERS THEREON THROUGH WHICH CONTACT PADS ARE EXPOSED

CROSS-REFERENCE TO RELATED APPLICATION

This application is a continuation of application Ser. No. 09/590,412, filed Jun. 8, 2000 now U.S. Pat. No. 6,326,698.

BACKGROUND OF THE INVENTION

1. Field of the Invention

The present invention relates generally to minimally packaged semiconductor devices having a protective layer of material on the active surfaces thereof and, more specifically, to the use of stereolithography to fabricate protective layers on the active surfaces of semiconductor device components. More particularly, the invention pertains to a method for fabricating protective structures on at least the active surfaces of semiconductor devices at the wafer level.

2. State of the Art

Minimally Packaged Semiconductor Devices

The large-scale production of particular types of semiconductor devices poses problems peculiar to the type of die, electronic circuits, external connectors and packaging. So-called "flip-chip" dice comprise electronic devices formed on a semiconductor substrate whose integrated circuitry terminates in an array of conductive sites on a die's active surface, which conductive sites are typically referred to as "bond pads." External conductive structures exemplified by well-known solder "bumps" or "balls" are attached to the bond pads. In use, the flip-chip die is inverted, positioned atop a substrate with contact pads matching the locations of the conductive structures of the die, and the conductive structures bonded to the contact pads of the substrate. Chip scale, flip-chip configured packages are also typically disposed facedown over a higher-level substrate with which the chip scale packages are to be connected.

In order to fabricate flip-chip dice in large quantities, several semiconductor dice are simultaneously fabricated on a wafer. The wafer is then scribed or sawn into individual dice, and finishing operations including packaging are conducted on the singulated dice.

It is typically desirable to apply a supportive or protective layer on at least the active surfaces of semiconductor devices, such as flip-chip type dice and chip scale packages, that will be disposed facedown over a higher-level substrate. Polymers, glass, and other electrically nonconductive materials can be applied to one or both major surfaces of such semiconductor devices. Conventionally, such layers are applied to a surface of a semiconductor device prior to attaching conductive structures to contact pads exposed at that surface. As the contact pads must be exposed through the layer so conductive structures can be secured to the contact pads, openings must also be formed in the layer to accommodate the subsequent attachment of conductive structures. Thus, an etching or other more complex additional process step is required.

When conventional techniques are employed to form a protective layer on a surface of a semiconductor device, it is difficult to form the protective layer when conductive structures have already been secured to the contact pads because of the close packing and small interstitial spacing between the conductive structures on state of the art semiconductor devices. If introduced onto the surface over the conductive structures, the material of the supportive or protective layer will have to be removed from the conductive structures. If introduced between the conductive structures, air pockets and voids can form in the layer of supportive or protective material.

Moreover, air pockets or voids can form when a so-called "underfill" material is introduced between a semiconductor device and a carrier substrate upon which the semiconductor device is disposed in facedown orientation. Although a vacuum may be used to draw the underfill into the interstices between the semiconductor device and the substrate, air pockets and voids nevertheless often persist in the underfill material. Thus, underfill layers with air pockets or voids may not completely support or protect the die or the conductive structures secured to the bond pads thereof. Furthermore, the use of a vacuum introduces undesirable additional complexity and time to the manufacturing process.

Accordingly, there is a need for a process by which supportive or protective layers can be formed on or applied to semiconductor devices without significantly increasing fabrication time and cost while producing a substantially uniform, solid, uninterrupted layer between contact pads of the semiconductor device or conductive structures secured thereto.

Stereolithography

In the past decade, a manufacturing technique termed "stereolithography," also known as "layered manufacturing," has evolved to a degree where it is employed in many industries.

Essentially, stereolithography, as conventionally practiced, involves utilizing a computer to generate a three-dimensional (3D) mathematical simulation or model of an object to be fabricated, such generation usually effected with 3D computer-aided design (CAD) software. The model or simulation is mathematically separated or "sliced" into a large number of relatively thin, parallel, usually vertically superimposed layers, each layer having defined boundaries and other features associated with the model (and thus the actual object to be fabricated) at the level of that layer within the exterior boundaries of the object. A complete assembly or stack of all of the layers defines the entire object, and surface resolution of the object is, in part, dependent upon the thickness of the layers.

The mathematical simulation or model is then employed to generate an actual object by building the object, layer by superimposed layer. A wide variety of approaches to stereolithography by different companies has resulted in techniques for fabrication of objects from both metallic and non-metallic materials. Regardless of the material employed to fabricate an object, stereolithographic techniques usually involve disposition of a layer of unconsolidated or unfixed material corresponding to each layer within the object boundaries, followed by selective consolidation or fixation of the material to at least a partially consolidated, or semisolid, state in those areas of a given layer corresponding to portions of the object, the consolidated or fixed material also at that time being substantially concurrently bonded to a lower layer of the object to be fabricated. The unconsolidated material employed to build an object may be supplied in particulate or liquid form, and the material itself may be consolidated or fixed or a separate binder material may be employed to bond material particles to one another and to those of a previously formed layer. In some instances, thin sheets of material may be superimposed to build an object, each sheet being fixed to a next-lower sheet and unwanted portions of each sheet removed, a stack of such sheets defining the completed object. When particulate materials are employed, resolution of object surfaces is highly dependent upon particle size, whereas when a liquid is employed, surface resolution is highly dependent upon the minimum surface area of the liquid which can be fixed and the minimum thickness of a layer that can be generated. Of course, in either case, resolution and accuracy of object reproduction from the CAD file is also dependent upon the ability of the apparatus used to fix the material to precisely track the mathematical instructions indicating solid areas and boundaries for each layer of material. Toward that end, and depending upon the layer being fixed, various fixation approaches have been employed, including particle bombardment (electron beams), disposing a binder or other fixative (such as by ink-jet printing techniques), or irradiation using heat or specific wavelength ranges.

An early application of stereolithography was to enable rapid fabrication of molds and prototypes of objects from CAD files. Thus, either male or female forms on which mold material might be disposed can be rapidly generated. Prototypes of objects might be built to verify the accuracy of the CAD file defining the object and to detect any design deficiencies and possible fabrication problems before a design is committed to large-scale production.

In more recent years, stereolithography has been employed to develop and refine object designs in relatively inexpensive materials, and has also been used to fabricate small quantities of objects where the cost of conventional fabrication techniques is prohibitive for same, such as in the case of plastic objects conventionally formed by injection molding. It is also known to employ stereolithography in the custom fabrication of products generally built in small quantities or where a product design is rendered only once. Finally, it has been appreciated in some industries that stereolithography provides a capability to fabricate products, such as those including closed interior chambers or convoluted passageways, which cannot be fabricated satisfactorily using conventional manufacturing techniques. It has also been recognized in some industries that a stereolithographic object or component may be formed or built around another, pre-existing object or component to create a larger product.

However, to the inventor's knowledge, stereolithography has yet to be applied to mass production of articles in volumes of thousands or millions, or employed to produce, augment or enhance products including other, pre-existing components in large quantities, where minute component sizes are involved, and where extremely high resolution and a high degree of reproducibility of results are required. In particular, the inventor is not aware of the use of stereolithography to fabricate protective layers for use on semiconductor devices, such as flip-chip type semiconductor devices or chip scale packages. Furthermore, conventional stereolithography apparatus and methods fail to address the difficulties of precisely locating and orienting a number of pre-existing components for stereolithographic application of material thereto without the use of mechanical alignment techniques or to otherwise assuring precise, repeatable placement of components.

SUMMARY OF THE INVENTION

The present invention includes a method of forming minimally packaged semiconductor device components and the semiconductor device components so formed. As used herein, the term "package" as employed with reference to electrical components includes partial as well as full covering of a given semiconductor device surface with a dielectric material, and specifically includes a semiconductor die configured in a so-called "chip scale" package, wherein the package itself, including the die, is of substantially the same dimensions as, or only slightly larger than, the die itself.

The method is particularly useful for packaging semiconductor devices, such as flip-chip type semiconductor dice and chip scale packages, that are to be disposed face-down over a higher-level substrate. The invention further encompasses a method for forming a protective layer on a surface of a semiconductor device to protect the surface and to laterally protect or support external conductive structures, such as solder balls, protruding from the surface. The method can also be used to apply a protective layer to the backside of a semiconductor device.

According to another aspect, the invention includes a method for bonding a semiconductor device, such as a flip-chip type semiconductor device or chip scale package, facedown to a higher-level substrate, such as a carrier substrate, wherein conductive structures connecting contact pads of the semiconductor device with corresponding terminals of the substrate are fully laterally encapsulated and sealed by a dielectric polymer. Assemblies formed by this method are also within the scope of the present invention.

The protective layers according to the present invention can be applied to individual substrates or to groups of substrates, such as the semiconductor devices on an undiced or unsingulated wafer, prior to separating the substrates from each other. Preferably, a stereolithographic process is employed to apply protective material to the substrate.

In the stereolithographic method of fabricating the protective layer, one or more layers of photopolymer may be applied to the surface of a semiconductor device configured to contact conductive structures (e.g., the active surface of a semiconductor die) and, optionally, to the opposite side of the semiconductor device (e.g., the backside of the semiconductor die). When stereolithographic processes are employed to fabricate protective layers in accordance with teachings of the present invention, conductive structures such as solder balls can be secured to contact pads of the semiconductor device either before or after fabrication of the protective layer. if the protective material is applied to a surface of a semiconductor device having conductive structures on the contact pads thereof, the protective material can substantially hermetically seal the surface about each conductive structure. The protective layer at least laterally protects the conductive structures and the surface of the semiconductor device from damage during the die singulation and subsequent process steps, as well as in assembling the semiconductor device with other components and in use of the semiconductor device.

A complementary protective layer may also be disposed on a surface of a higher-level substrate to which the semiconductor device is to be joined. When protective material is disposed on the surface of the higher-level substrate, receptacles, through which the contact pads, or terminals, of the higher-level substrate are exposed, can be formed through the protective layer. These receptacles are configured to receive corresponding conductive structures protruding from a semiconductor device to be disposed facedown over the higher-level substrate.

Preferably, the protective layers on the semiconductor device and on the higher-level substrate upon which the semiconductor device is to be disposed are configured to abut upon assembly of the semiconductor device and the higher-level substrate while permitting conductive structure protruding from the semiconductor device to contact corresponding contact pads of the higher-level substrate. Thus, the abutting protective layers will provide a seal between the substrates, and no further packaging of the assembly is necessary. The protective layers on the two assembled structures may be further secured to each other, such as with adhesive or by subjecting the abutting protective layers to additional curing, such as heat, to form a unitary, substantially hermetic seal.

Moreover, the stereolithographic method has sufficient resolution so that when protective layers are fabricated on the surfaces of both a semiconductor device and the higher-level substrate upon which the semiconductor device is to be disposed, the combined, abutting protective layers form an underfill layer that is substantially free of undesirable air pockets (i.e., bubbles) or other voids.

In an exemplary stereolithographic process, a layer of liquid photopolymer is placed on the surface of a substrate (e.g., by submergence), and a focused laser beam is projected into the photopolymer layer to cure it and form a layer of at least partially cured polymer at desired locations on the surface of the substrate. The process may be repeated as required to form a series of built-up polymer layers of controlled thickness and location. Together, the layers comprise a single dielectric structure of precisely controlled dimensions and shape.

The packaging method of the present invention may be applied, by way of example and not limitation, to dice of a multi-die wafer or partial wafer, to singulated dice, to other types of semiconductor devices taken singly, simultaneously to a plurality of separate semiconductor devices, to one or more substrates, or simultaneously to groups including different types of semiconductor devices or substrates.

The present invention preferably employs computer-controlled, 3D CAD initiated, stereolithography techniques to fabricate the protective layers of the present invention. When stereolithographic processes are employed, the protective layers are each formed as either a single layer or a series of superimposed, contiguous, mutually adhered layers of material.

When the protective layers are fabricated directly on a semiconductor device or test substrate by use of stereolithography, the protective layers can be fabricated to extend to a given plane regardless of any irregularities on or nonplanarity of the surface of the semiconductor device on which the protective layer is fabricated.

The stereolithographic method of fabricating the protective layers of the present invention preferably includes the use of a machine vision system to locate the semiconductor devices or test substrates on which the protective layers are to be fabricated, as well as the features or other components on or associated with the semiconductor devices or test substrates (e.g., solder bumps, contact pads, conductor traces, etc.). The use of a machine vision system directs the alignment of a stereolithography system with each semiconductor device or test substrate for material disposition purposes. Accordingly, the semiconductor devices or test substrates need not be precisely mechanically aligned with any component of the stereolithography system to practice the stereolithographic embodiment of the method of the present invention.

In a preferred embodiment, the protective layer to be fabricated or positioned upon and secured to a semiconductor device or a test substrate in accordance with the invention is fabricated using precisely focused electromagnetic radiation in the form of an ultraviolet (UV) wavelength laser under control of a computer and responsive to input from a machine vision system, such as a pattern recognition system, to fix or cure selected regions of a layer of a liquid photopolymer material disposed on the substrate.

Other features and advantages of the present invention will become apparent to those in the art through consideration of the ensuing description, the accompanying drawings, and the appended claims.

BRIEF DESCRIPTION OF THE SEVERAL VIEWS OF THE DRAWINGS

Examples of the invention are illustrated in the following figures, in which the dimensions are not necessarily shown to scale, wherein.

DETAILED DESCRIPTION OF THE INVENTION

Protective Layers and Semiconductor Devices Including Same

Figure 1:
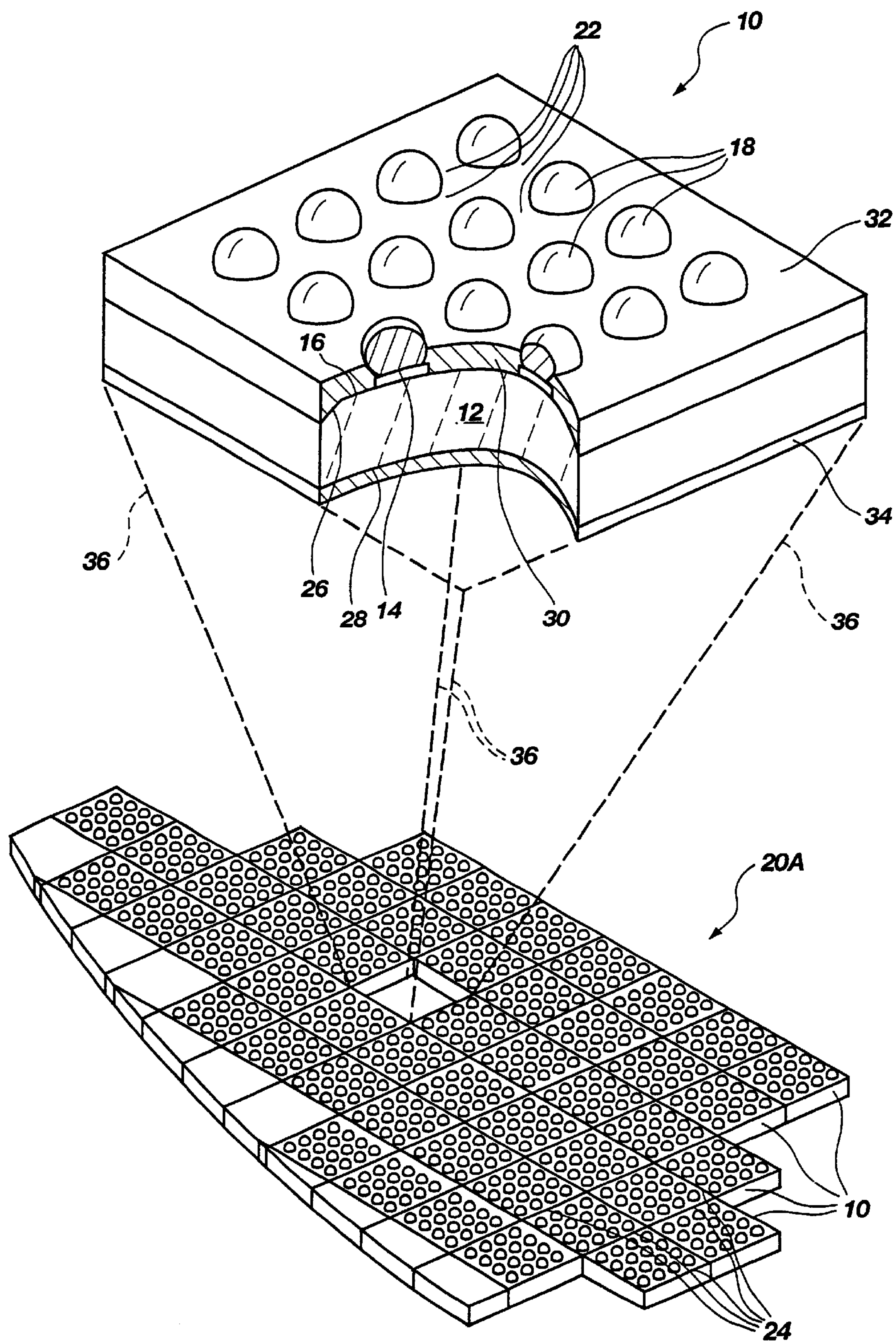
FIG. 1 is a cutaway perspective view of one embodiment of a packaged semiconductor flip-chip die of the invention and a reduced scale view of a portion of a circular wafer from which the die is singulated.

In one aspect of the invention, as illustrated in FIG. 1, a semiconductor device 10 is formed as part of a multi-device wafer 20, a small portion 20A of which is shown. As used herein, the term "wafer" encompasses other semiconductor substrates, including silicon-on-insulator (SOI), silicon-on-glass (SOG), silicon-on-sapphire (SOS), etc. Projection lines 36 extend to an enlarged view of a semiconductor device 10 singulated from wafer 20 to illustrate the features of semiconductor device 10 in greater detail. The exemplary semiconductor device 10 is depicted as comprising a die 12, also referred to herein as a substrate, with an array of bond pads 14, which are also referred to herein as contact pads, mounted on an upper or active surface 16 of die 12. Alternatively, semiconductor device 10 can be a chip scale package. Bond pads 14 may be any type of conductive site on a die 12 to which a conductive structure 18, such as a conductive ball, bump, or pillar, may be affixed. Conductive structures 18 may be affixed to bond pads 14 by conventional methods either before or after layer 30 is applied to active surface 16.

A layer 30 of protective material having a planar upper surface 32 is formed on active surface 16 of die 12 including between conductive structures 18 in interstitial spaces 22. Layer 30 is preferably formed from a photoimageable polymer and may include two or more superimposed, contiguous, mutually adhered layers.

Semiconductor device 10 is illustrated in FIG. 1 as including a bevel 26 at the periphery of active surface 16 of die 12. According to the invention, bevel 26 can be filled with the material of layer 30 while the planar surface of layer 30 is maintained. Filling bevel 26 with the material of layer 30 in this manner protects the exposed edges of active surface 16. As the periphery of the active surface 16 corresponds to and is defined by the scribe lines 24 of wafer 20, and is often subject to damage from cutting in the singulation step and during subsequent handling, other non-planarities, such as rounded edges or gouges, may occur at the periphery of active surface 16. These other non-planarities of active surface 16 of die 12 can also be compensated for by layer 30.

In addition, the backside 28 of multi-device wafer 20 may also have a layer 34 of polymeric material applied thereto for protection. Layer 34 is also preferably formed from a photopolymer applied in one or more layers. Methods other than stereolithography may alternatively be used for applying a protective coating 34 to the backside 28.

Figure 2:
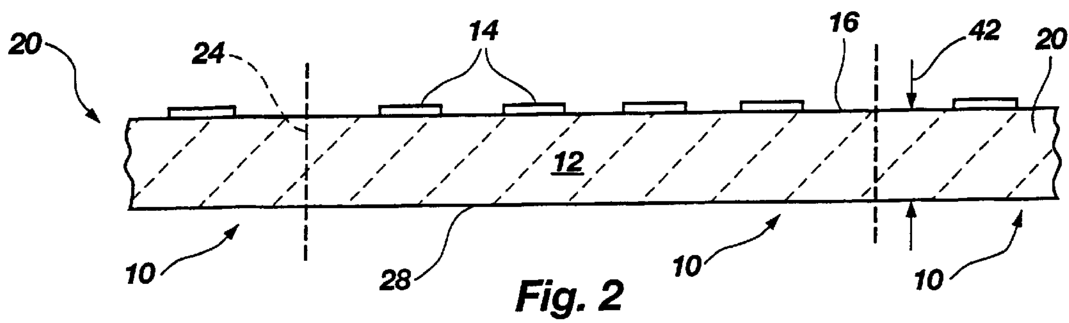
FIG. 2 is a cross-sectional side view of a portion of a circular wafer illustrating a wafer-stage fabrication step of the invention.

A method of forming semiconductor devices 10 in accordance with teachings of the present invention is illustrated in FIGS. 2–7. Wafer 20 of semiconductive material is processed into a plurality, typically hundreds or even thousands, of individual semiconductor devices, referred to herein as dice 12. As shown in FIG. 2, separate dice 12 are defined on wafer 20 by scribe lines 24, which also represent the peripheries of the active surfaces 16 of dice 12. An array of bond pads 14 is exposed at active surface 16 of each die 12. The thickness 42 of wafer 20 is the distance from active surface 16 to backside 28 of each die 12.

Figure 3:
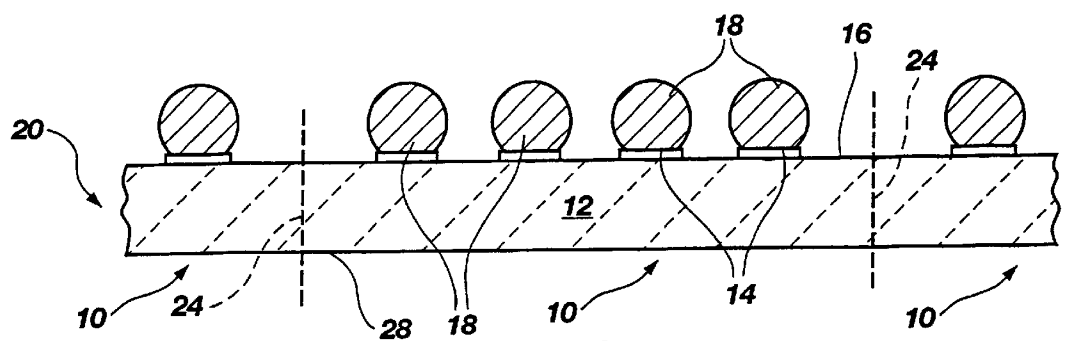
FIG. 3 is a cross-sectional side view of a portion of a circular wafer illustrating an external connector attachment step of the invention.

In FIG. 3, the attachment of conductive structures 18, such as conductive bumps or pillars, to bond pads 14 is illustrated. Exemplary conductive structures 18 include, without limitation, solder balls or bumps, conductive pillars, conductive or conductor-filled epoxy pillars, and structures of z-axis elastomers. Methods of attaching different types of conductive structures 18 are well known in the art.

Figure 4:
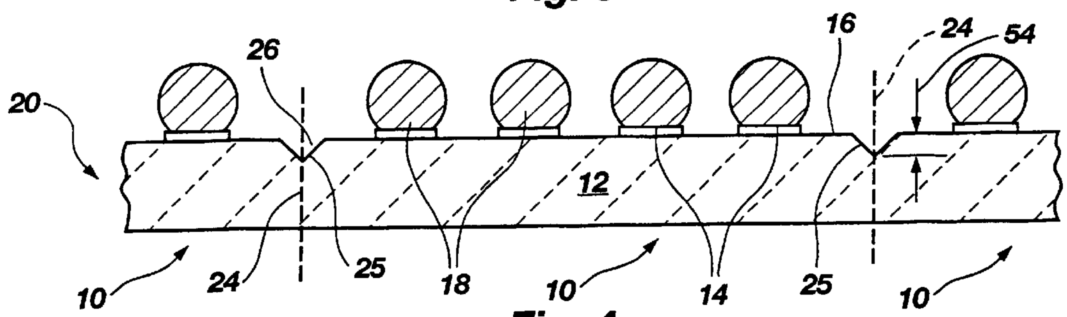
FIG. 4 is a cross-sectional side view of a portion of a circular wafer illustrating an optional step of providing a bevel on the active surface edges of each die of a circular wafer in accordance with the invention.

As depicted in FIG. 4, beveled cuts 25 may be made along each scribe line 24 traversing active surface 16 of wafer 20 to form bevels 26 that traverse active surface 16 along the peripheries of adjacent dice 12. The depth 54 of each bevel 26 need only be sufficient to isolate dice 12 along the streets between die 12 locations without excessively reducing the strength of wafer 20. Bevel depth 54 is generally less than about ⅓ of wafer thickness 42. Although beveled cut 25 is depicted as a "V"-shaped cut, it may alternatively be arcuate or quadrilateral. Beveled cut 25 may be made at any time prior to applying layer 30 (see FIG. 1) to active surface 16, as will be described subsequently in reference to FIG. 6.

Figure 5:
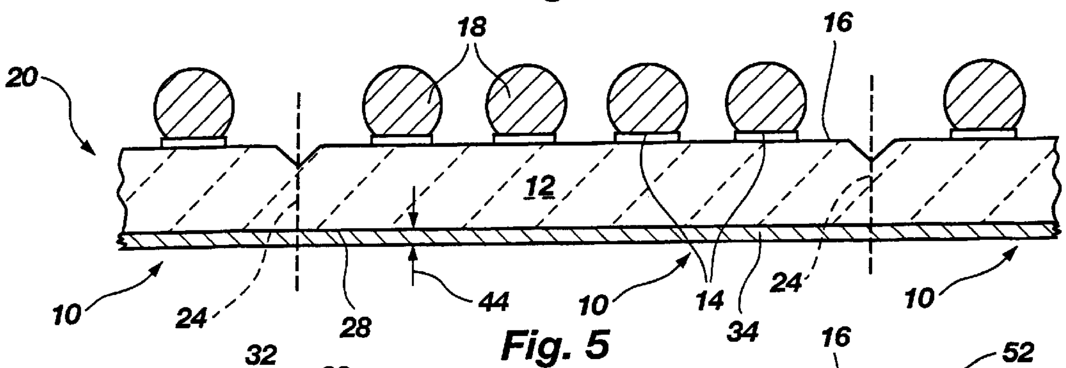
FIG. 5 is a cross-sectional side view of a portion of a circular wafer illustrating an optional step of coating the reverse surface of a circular wafer in accordance with the invention.

As shown in FIG. 5, backside 28 of wafer 20 may be coated with a layer 34 of protective material to prevent damage during singulation, packaging, and use. Layer 34 may be applied by any means known in the art, but is preferably applied by a stereolithographic process, such as the hereinafter more fully described stereolithography processes, wherein one or more thin layers of photopolymeric material are placed on backside 28 and scanned with a light beam to at least partially polymerize the material. Layer 34 has a thickness 44 and may comprise a single layer of material or two or more superimposed, contiguous, mutually adhered layers.

Layer 34 may be applied at any convenient point in the semiconductor device fabrication process, including prior to fabricating any semiconductor device structures on active surface 16 of wafer 20. Layer 34 may even be applied following singulation of dice 12 from wafer 20.

Figure 6:
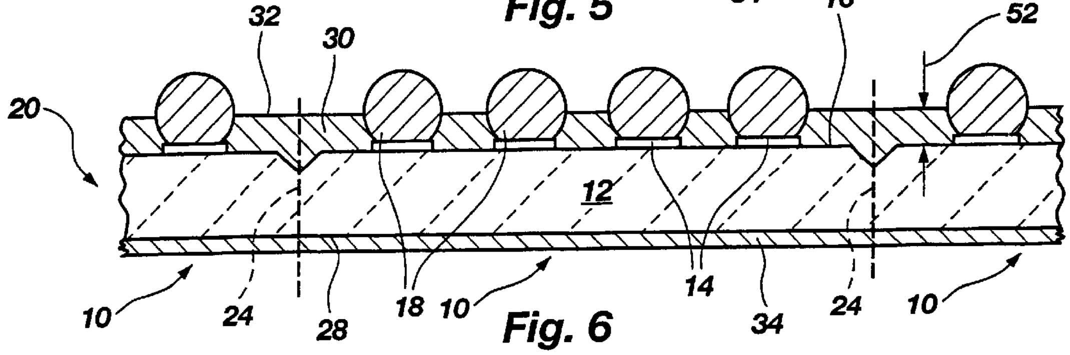
FIG. 6 is a cross-sectional side view of a portion of a circular wafer illustrating the step of stereolithographically forming a protective structure over the active surface of a circular wafer to package a die in accordance with the invention.
Figure 6A:
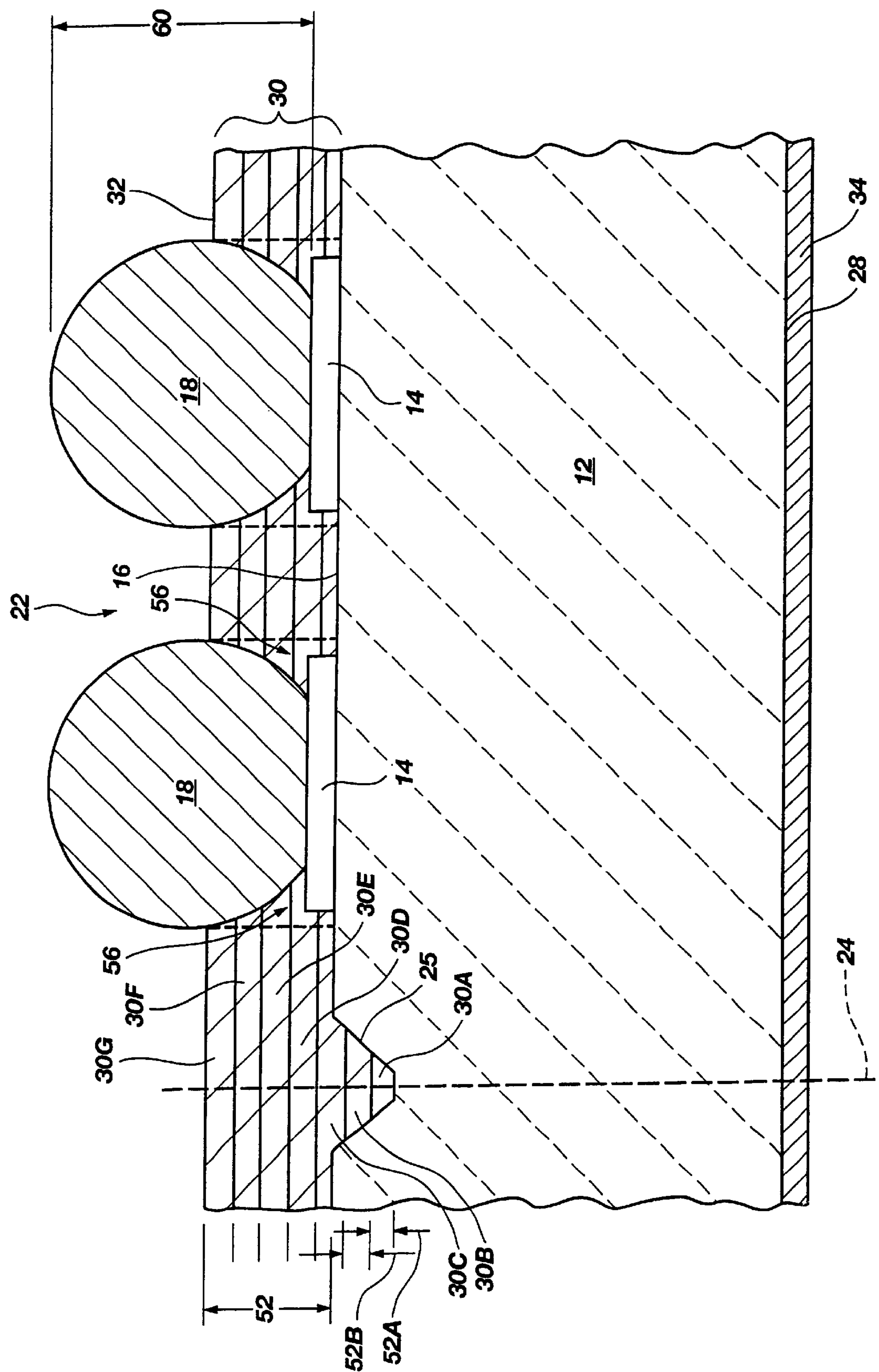
FIG. 6A is an enlarged cross-sectional side view of a portion of a circular wafer illustrating details in stereolithographically forming a protective structure over the active surface of the circular wafer.

FIGS. 6 and 6A illustrate the packaging of a large number of dice 12 to form flip-chip type devices 10 according to the present invention. Dice 12 may be stereolithographically packaged at the wafer level with, e.g., a photopolymer material. A protective layer 30 is at least partially polymerized in situ over active surface 16, including within interstitial spaces 22 between adjacent bond pads 14 or conductive structures 18, as well as filling any bevel spaces 26 or other non-planar recessed features of active surface 16.

As generally illustrated in FIG. 6A, the stereolithography process comprises disposing a first, thin layer 30A of photopolymer material in beveled cut 25 and at least partially polymerizing, or solidifying, the material of layer 30A. The photopolymer material of first layer 30A adheres to active surface 16 of die 12. The process is repeated, forming additional layers 30B, 30C, 30D, 30E, 30F and 30G to sequentially build layer 30 covering active surface 16 and laterally adjacent to lower portions of conductive structures 18. The thickness 52A of first layer 30A, 52B of layer 30B, etc., and the number of layers 30A, 30B, etc. may be varied as desired so as to achieve the desired structure thickness 52 and resolution between the upper surface 32 of layer 30 and active surface 16. A layer 30 of superimposed, contiguous, mutually adhered layers of predetermined thickness 52 is so formed. Preferably, upper surface 32 is a substantially planar surface that is substantially parallel to active surface 16 of die 12.

As shown in FIG. 6A, when conductive structures 18 are solder balls, a shadowed space 56 is created when a coherent light beam is vertically directed onto die 12. As a result of photopolymer in this area not being exposed to such a vertically directed light beam, the degree of polymerization of photopolymer in this space is reduced, particularly in the locations of shadowed space 56 farthest from the light beam. In the upper, narrower portions of shadowed space 56, some polymerization of the photopolymer will occur, forming a semisolid "cap" that can adhere to the adjacent portions of conductive structures 18. Underlying photopolymer within the remaining portions of shadowed space 56 may remain in a liquid or semiliquid state until wafer 20 is removed from the stereolithography apparatus and fully or almost fully cured by another curing process, such as by heating the photopolymer.

Upper surface 32 of layer 30 is preferably located so that a sufficient portion of each conductive structure 18 protrudes from layer 30 to facilitate attachment of conductive structures 18 to corresponding contact pads of a carrier substrate or other semiconductor device component. In general, the thickness 52 of layer 30 may be about 20% to about 60% of the height 60 of conductive structure 18. Preferably, the thickness 52 of layer 30 is about 40% to about 50% of the height 60 of conductive structure 18.

Figure 7:
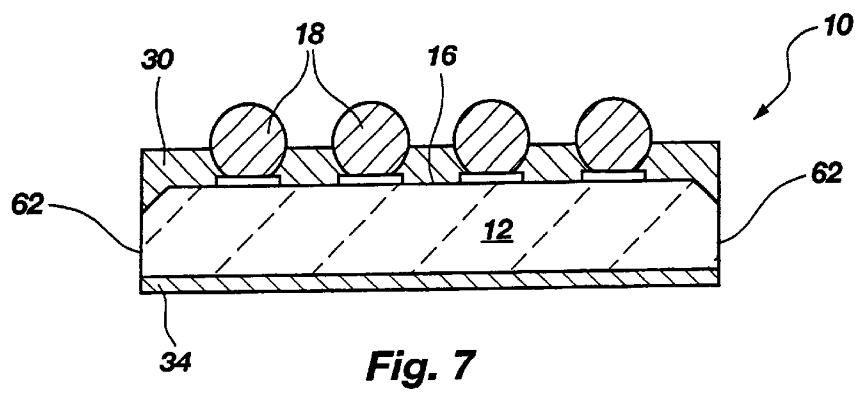
FIG. 7 is a cross-sectional side view of a packaged semiconductor die singulated from a circular wafer.

As shown in FIG. 7, singulation of wafer 20 into individual dice 12 by cutting through beveled cuts 25 produces packaged semiconductor devices 10. A final curing of the photopolymer layers 30 and 34 may be performed either before or after singulation. If it is desired to apply a protective layer onto the lateral sides 62 of dice 12, this may be done by any known process, including by stereolithography, following singulation of dice 12 from wafer 20. In general, however, sides 62 require no further packaging.

Figure 8:
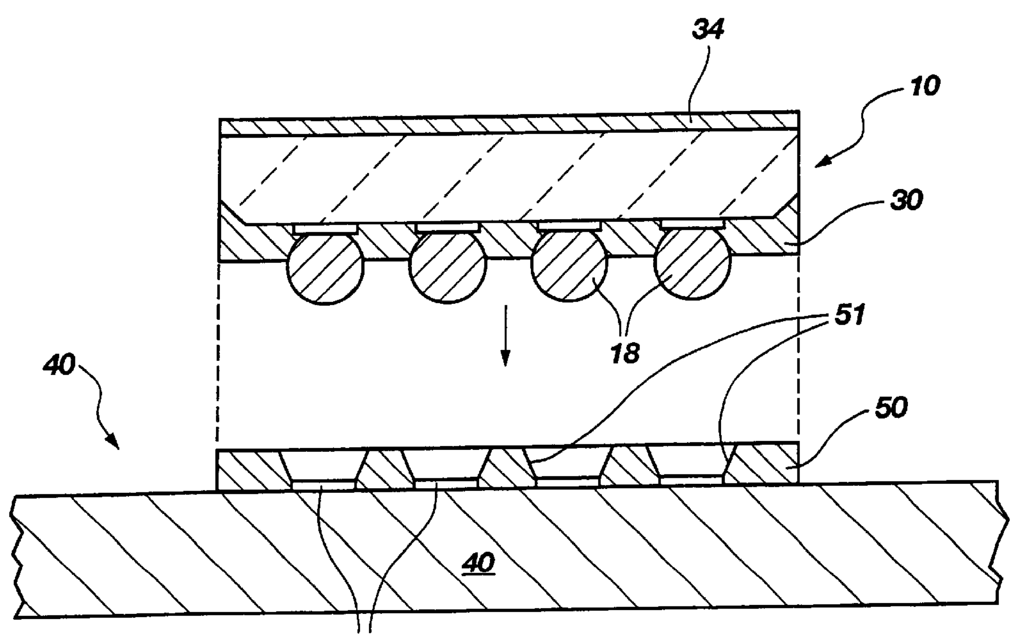
FIG. 8 is a cross-sectional side view of a packaged semiconductor die and a carrier substrate configured to be attached thereto, in accordance with the invention.
Figure 9:
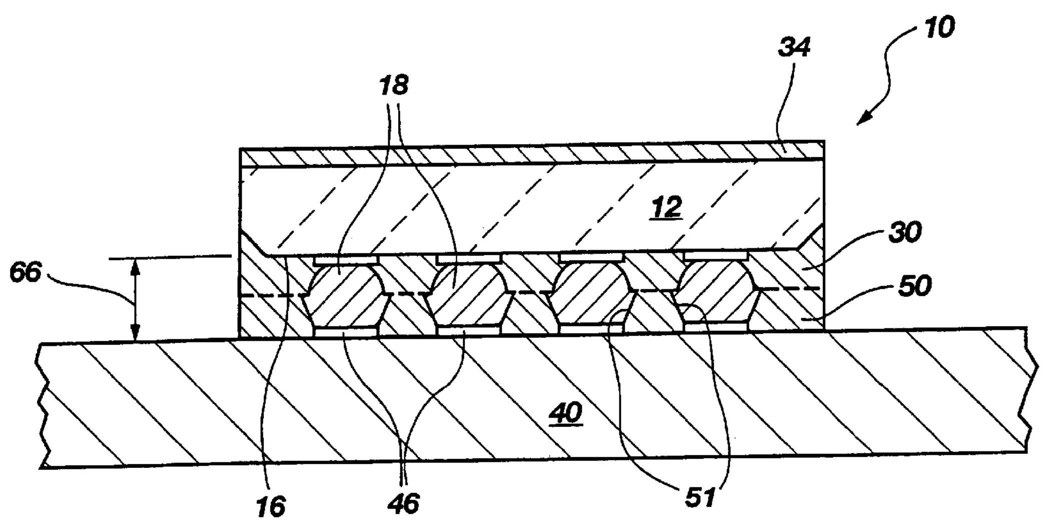
FIG. 9 is a cross-sectional side view of a packaged semiconductor die attached to a carrier substrate in accordance with the invention.

In another facet of the present invention, which is illustrated in FIGS. 8 and 9, a layer 50 with receptacles 51 recessed therein for receiving conductive structures 18 is formed, with receptacles 51 being located about contact pads 46 on a substrate 40. Each receptacle 51 receives a correspondingly located conductive structure upon assembling a device 10 of the type described above in reference to FIGS. 1–7 with substrate 40. Layer 30 of device 10 will abut layer 50 on substrate 40 upon assembly of device 10, a first substrate, with substrate 40, a second substrate. Upon assembly of device 10 and substrate 40, each conductive structure 18 is substantially hermetically sealed. Thus, additional packaging steps are unnecessary, and the use of more complex, less reliable processes for sealing the space between device 10 and substrate 40 is avoided.

When device 10 and substrate 40 are assembled, layer 50 and layer 30 have a combined thickness 66. The volume of each receptacle 51 and the corresponding space in layer 30 that laterally surrounds a conductive structure 18 can be collectively configured so as to substantially equal the volume of the conductive structure 18. Thus, conductive structure 18 will completely fill receptacle 51 and the space in layer 30 upon bonding to bond pad 14 of die 12 or contact pad 46 of substrate 40. Although layer 50 may be fabricated by other methods, the use of stereolithography is preferred because of the high precision, repeatability, conservation of material, and speed.

Alternatively, conductive structures 18 can be secured to contact pads 46 of substrate 40. Conductive structures 18 can be secured to contact pads 46 either before or after layer 50 has been fabricated. If layer 30 or layer 50 is formed prior to securing conductive structures to bond pads 14 or contact pads 46, respectively, voids in layer 30 through which bond pads 12 are exposed or receptacles 51 in layer 50 can define the shapes of conductive structures 18.

Stereolithographic Fabrication of Protective Layers

Figure 10:
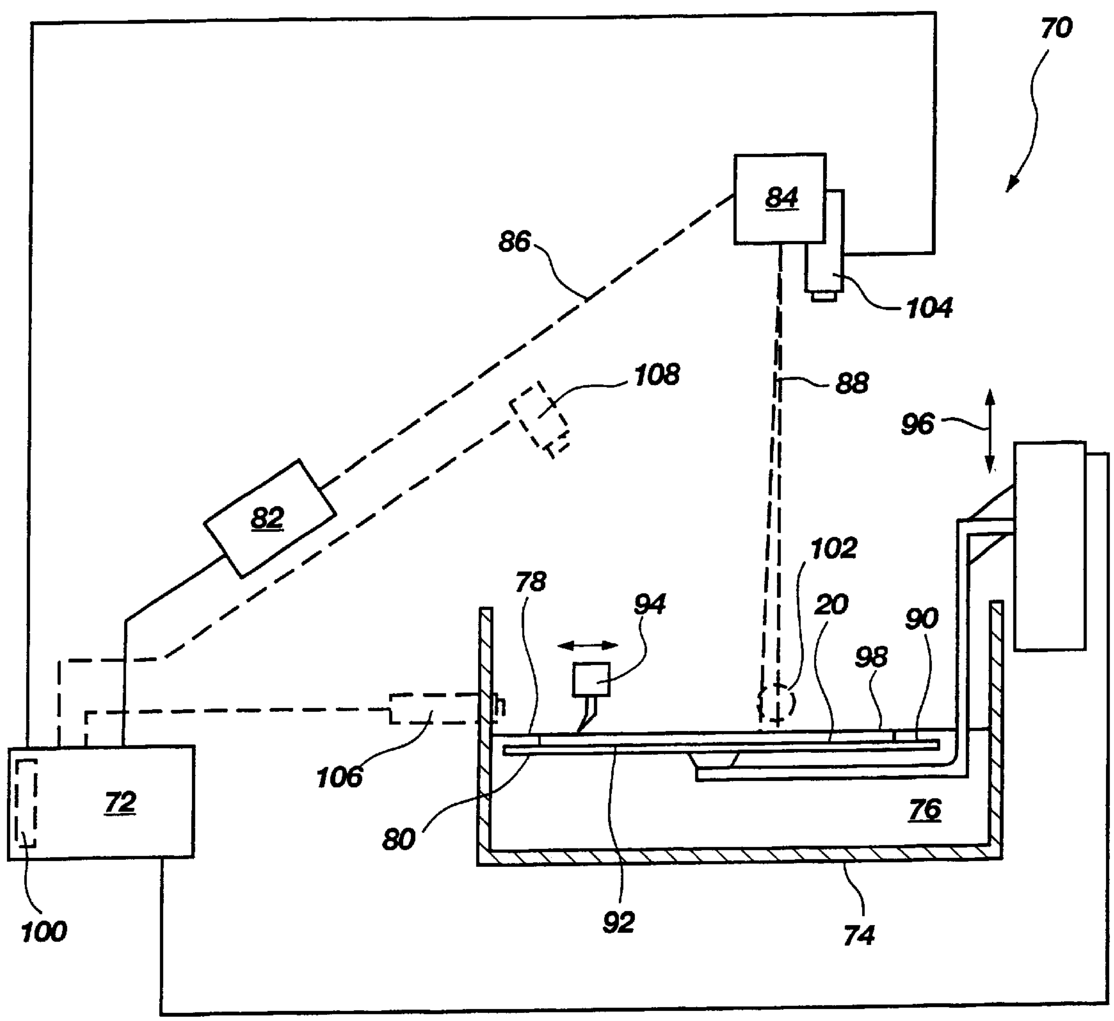
FIG. 10 is a schematic side elevation of an exemplary stereolithography apparatus suitable for use in practicing the method of the present invention.

FIG. 10 depicts schematically various components, and operation, of an exemplary stereolithography apparatus 70 to facilitate the reader's understanding of the technology employed in implementation of the present invention, although those of ordinary skill in the art will understand and appreciate that apparatus of other designs and manufacture may be employed in practicing the method of the present invention. The preferred, basic stereolithography apparatus for implementation of the present invention, as well as operation of such apparatus, are described in great detail in United States patents assigned to 3D Systems, Inc. of Valencia, Calif., such patents including, without limitation, U.S. Pat. Nos. 4,575,330; 4,929,402; 4,996,010; 4,999,143; 5,015,424; 5,058,988; 5,059,021; 5,059,359; 5,071,337; 5,076,974; 5,096,530; 5,104,592; 5,123,734; 5,130,064; 5,133,987; 5,141,680; 5,143,663; 5,164,128; 5,174,931; 5,174,943; 5,182,055; 5,182,056; 5,182,715; 5,184,307; 5,192,469; 5,192,559; 5,209,878; 5,234,636; 5,236,637; 5,238,639; 5,248,456; 5,256,340; 5,258,146; 5,267,013; 5,273,691; 5,321,622; 5,344,298; 5,345,391; 5,358,673; 5,447,822; 5,481,470; 5,495,328; 5,501,824; 5,554,336; 5,556,590; 5,569,349; 5,569,431; 5,571,471; 5,573,722; 5,609,812; 5,609,813; 5,610,824; 5,630,981; 5,637,169; 5,651,934; 5,667,820; 5,672,312; 5,676,904; 5,688,464; 5,693,144; 5,695,707; 5,711,911; 5,776,409; 5,779,967; 5,814,265; 5,850,239; 5,854,748; 5,855,718; 5,855,836; 5,885,511; 5,897,825; 5,902,537; 5,902,538; 5,904,889; 5,943,235; and 5,945,058. The disclosure of each of the foregoing patents is hereby incorporated herein by this reference. As noted in more detail below, however, a significant modification is made to conventional stereolithographic apparatus, such as those offered by 3D Systems, Inc., in the context of initiation and control of the stereolithographic disposition and fixation of materials. Specifically, the apparatus of the present invention employs a so-called "machine vision" system, in combination with suitable programming of the computer controlling the stereolithographic process, to eliminate the need for accurate positioning or mechanical alignment of work pieces to which material is stereolithographically applied, and expands the use of conventional stereolithographic apparatus and methods to application of materials to large numbers of work pieces which may differ in orientation, size, thickness, and surface topography. While the work pieces employed in the practice of the preferred embodiment of the method of the invention are, by way of example only, semiconductor dice, wafers, partial wafers, other substrates of semiconductor material bearing integrated circuits on dice, or other semiconductor structures, the method and apparatus of the invention are applicable to fabrication of other products wherein adaptability for rapidly fabricating large numbers of parts having the aforementioned variations in orientation, size, thickness and surface topography is desired.

With reference again to FIG. 10 and as noted above, a 3D CAD drawing of an object or structure (such as layers 30, 34, and 50) to be fabricated in the form of a data file is placed in the memory of a computer 72 controlling the operation of apparatus 70 if computer 72 is not a CAD computer in which the original object design is effected. In other words, an object design may be effected in a first computer in an engineering or research facility and the data files transferred via wide or local area network, tape, disc, CD-ROM or otherwise as known in the art to computer 72 of apparatus 70 for object fabrication.

The data is preferably formatted in an STL (for STereoLithography) file, STL being a standardized format employed by a majority of manufacturers of stereolithography equipment. Fortunately, the format has been adopted for use in many solid-modeling CAD programs, so often translation from another internal geometric database format is unnecessary. In an STL file, the boundary surfaces of an object are defined as a mesh of interconnected triangles.

Apparatus 70 also includes a reservoir 74 (which may comprise a removable reservoir interchangeable with others containing different materials) of material 76 to be employed in fabricating the intended object. In the currently preferred embodiment, the liquid is a photo-curable polymer (hereinafter "photopolymer") responsive to light in the UV wavelength range. The surface level 78 of the material 76 is automatically maintained at an extremely precise, constant magnitude by devices known in the art responsive to output of sensors within apparatus 70 and preferably under control of computer 72. A support platform or elevator 80, precisely vertically movable in fine, repeatable increments responsive to control of computer 72, is located for movement downward into and upward out of material 76 in reservoir 74. A UV range laser plus associated optics and galvanometers (collectively identified as 82) for controlling the scan of laser beam 86 in the X-Y plane across platform 80 has associated therewith mirror 84 to reflect beam 86 downwardly as beam 88 toward surface 90 of platform 80. Beam 88 is traversed in a selected pattern in the X-Y plane, that is to say, in a plane parallel to surface 90, by initiation of the galvanometers under control of computer 72 to at least partially cure, by impingement thereon, selected portions of material 76 disposed over surface 90 to at least a semisolid state. The use of mirror 84 lengthens the path of the laser beam, effectively doubling same, and provides a more vertical beam 88 than would be possible if the laser 82 itself were mounted directly above platform surface 90, thus enhancing resolution.

Again referring to FIG. 10, data from the STL files resident in computer 72 are manipulated to build an object, e.g., one or more layers 30, 34, or 50, one sublayer at a time. Accordingly, the data mathematically representing layer 30, 34, or 50 is divided into subsets, each subset representing a slice or sublayer of the layer. This is effected by mathematically sectioning the 3-D CAD model into a plurality of horizontal layers, a "stack" of such layers representing the object or structure being fabricated. Each slice or layer may be from about 0.0001 to about 0.0300 inch thick. As mentioned previously, a thinner slice promotes higher resolution by enabling better reproduction of fine, vertical surface features of layer 30, 34, or 50. In some instances, one or more base supports 92 for nearly perfectly horizontally supporting or preventing lateral movement of wafer 20, substrate 40, individual die 12, or other substrate may also be programmed as a separate STL file, such supports 92 being fabricated before the overlying wafer, substrate or die is placed thereon. The supports 92 facilitate fabrication of an object or structure with reference to a perfectly horizontal plane and removal of the object or structure from surface 90 of platform 80. Where a "recoater" blade 94 is employed as described below, the interposition of base supports 92 precludes inadvertent contact of recoater blade 94 with surface 90. A recoater blade 94 cannot be used in forming the protective layer 30, 34, or 50 on a substrate when conductive structures 18 protrude because a recoater blade 94 would interfere with such protruding conductive structures 18. Of course, alternative methods and apparatus for securing a substrate to platform 80 and immobilizing the substrate to platform 80 may also be used and are within the scope of the present invention.

Before fabrication of a layer 30, 34, or 50 or other structure is initiated with apparatus 70, the primary STL file for layer 30, 34, or 50 and the file for base support(s) 92 are merged. It should be recognized that, while reference has been made to a single layer or other structure, multiple objects may be concurrently fabricated on or above surface 90 of platform 80. For example, a large number of devices 10 on a wafer 20 may have differing configurations requiring differing STL file input. In such an instance, the STL files for the various objects and supports, if any, are merged. Operational parameters for apparatus 70 are then set, for example, to adjust the size (diameter, if circular) of the laser light beam used to cure material 76.

Before initiating fabrication of a first layer 98 for a support 92 or layer 30, 34, or 50 is commenced, computer 72 automatically checks and, if necessary, adjusts by means known in the art, as referenced above, the surface level 78 of material 76 in reservoir 74 to maintain same at an appropriate focal length for laser beam 88. U.S. Pat. No. 5,174,931, referenced above and previously incorporated herein by reference, discloses one suitable level control system. Alternatively, the height of mirror 84 may be adjusted responsive to a detected surface level 78 to cause the focal point of laser beam 88 to be located precisely at the surface of material 76 at surface level 78 if level 78 is permitted to vary, although this approach is somewhat more complex. The platform 80 may then be submerged in material 76 in reservoir 74 to a depth equal to the thickness of one layer or slice of layer 30, 34, or 50 or other structure, and the surface level 78 readjusted as required to accommodate material 76 displaced by submergence of platform 80. Laser 82 is then activated so that laser beam 88 will scan material 76 over surface 90 of platform 80 to at least partially consolidate (e.g., at least partially cure or polymerize) material 76 at selective locations, defining the boundaries of a first sublayer 30A (of layer 30; for example, see FIG. 6A) and filling in solid portions thereof. Platform 80 is then lowered by a distance equal to the thickness of a sublayer 30B, raised to a depth equal to the thickness thereof, and the laser beam 88 scanned again to define and fill in the second sublayer 30B while simultaneously bonding the second sublayer to the first. The process is then repeated, sublayer by sublayer, until layer 30, 34, or 50 is completed.

If a recoater blade 94 is employed in forming layer 30, 34, or 50, the process sequence is somewhat different. In this instance, the surface 90 of platform 80 is lowered into material 76 below surface level 78, then raised thereabove until it is precisely one layer's thickness below blade 94. Blade 94 then sweeps horizontally over surface 90, or (to save time) at least over a portion thereof on which layer 30, 34, or 50 is to be built, to remove excess material 76 and leave a film thereof of the precise desired thickness above surface 90. Platform 80 is then lowered so that the surface of the film and material level 78 are coplanar and the surface of the material 76 is still. Laser 82 is then initiated to scan with laser beam 88 and define a first layer. The process is repeated, sublayer by sublayer, to define each succeeding sublayer and simultaneously bond same to the next-lower sublayer until layer 30, 34, or 50 is completed. A more detailed discussion of this sequence and apparatus for performing same is disclosed in U.S. Pat. No. 5,174,931, previously incorporated herein by reference.

As an alternative to the above approach to preparing a layer 98 of material 76 for scanning with laser beam 88, a layer of material 76 may be formed on surface 90, wafer 20, die 12, substrate 40, or other substrate by lowering platform 80 to flood material over the surface, die or substrate, or the highest completed sublayer of layer 30, 34, or 50 being fabricated, then raising platform 80 and horizontally traversing a so-called "meniscus blade" across platform 80 or formed portion of layer 30, 34, or 50 or other structure on platform 80 one sublayer thickness thereabove, followed by initiation of laser 82 and scanning of beam 88 to define the next-higher sublayer.

Yet another alternative to sublayer preparation of material 76 is to merely lower platform 80 in direction 96 to a depth equal to a layer 98 of material 76 over the previously formed sublayer, and then traverse a combination flood bar and meniscus bar assembly horizontally over the structure (e.g., layer 30, 34, 50) being formed to substantially concurrently flood material 76 over the structure and define a precise sublayer thickness of material 76 for scanning.

All of the foregoing approaches to liquid material flooding and layer definition and apparatus for initiation thereof are known in the art and are not material to practice of the present invention, so no further details relating thereto will be provided herein.

The use of a large number of sublayers may be employed to substantially simulate the shapes of the outer surfaces of conductive structures to be encompassed by layer 30, 34, or 50.

Each sublayer of layer 30, 34, or 50 is preferably built by first defining any internal and external object boundaries of that layer with laser beam 88, then hatching solid areas of the structure with laser beam 88. If a particular part of a particular sublayer is to form a boundary of a void in layer 30, 34, 50, or other object above or below that sublayer, then the laser beam 88 is scanned in a series of closely spaced, parallel vectors so as to develop a continuous surface, or skin, with improved strength and resolution. The time it takes to form each sublayer depends upon its geometry, surface tension and viscosity of material 76, and thickness of the sublayer.

Once layer 30, 34, or 50 or other structure is completed, platform 80 is elevated above surface level 78 of material 76, and the platform 80 with wafer 20, die 12, substrate 40, or other substrate may be removed from apparatus 70. Excess, uncured material 76 on the surface of wafer 20, die 12, substrate 40, or other substrate may be manually removed, followed by solvent cleaning and removal from platform 80, usually by cutting it free of base supports 92. The STL-formed structure(s) may then require postcuring, as material 76 may be only partially polymerized and exhibit only a portion (typically 40% to 60%) of its fully cured strength. Postcuring to completely harden the layers 30, 34, and 50 may be effected in another apparatus projecting UV radiation in a continuous manner over wafer 20, die 12, substrate 40, or other substrate and/or by thermal completion of the initial, UV-initiated partial cure.

In practicing the present invention, a commercially available stereolithography apparatus operating generally in the manner as that described above with respect to apparatus 70 of FIG. 10 is preferably employed, but with further additions and modifications as hereinafter described for practicing the method of the present invention. For example and not by way of limitation, the SLA-250/50HR, SLA-5000 and SLA-7000 stereolithography systems, each offered by 3D Systems, Inc., of Valencia, Calif., are suitable for modification. Photopolymers believed to be suitable for use in practicing the present invention include Cibatool SL 5170 and SL 5210 resins for the SLA-250/50HR system, Cibatool SL 5530 resin for the SLA-5000 and Cibatool SL 7510 for the SLA-7000 system. All of these resins are available from Ciba Specialty Chemicals Corporation. By way of example and not limitation, the layer thickness of material 76 to be formed, for purposes of the invention, may be on the order of 0.001 to 0.020 inch, with a high degree of uniformity over a field on a surface 90 of a platform 80. It should be noted that different material layers may be of different heights or thicknesses, so as to form a structure of a precise, intended total height or thickness, or to provide different material thicknesses for different portions of the structure. The size of the laser beam "spot" impinging on the surface of material 76 to cure same may be on the order of 0.002 inch to 0.008 inch. Resolution is preferably ±0.0003 inch in the X-Y plane (parallel to surface 90) over at least a 0.5 inch×0.25 inch field from a center point, permitting a high resolution scan effectively across a 1.0 inch×0.5 inch area. Of course, it is desirable to have substantially this high a resolution across the entirety of the platform surface 90 or wafer 20 to be scanned by the laser beam 88, which area may be termed the "field of exposure," such area being substantially coextensive with the vision field of a machine vision system employed in the apparatus of the invention as explained in more detail below. The longer and more effectively vertical the path of laser beam 86/88, the greater the achievable resolution.

Referring again to FIG. 10 of the drawings, it should be noted that apparatus 70 of the present invention includes a camera 104 (and, optionally, additional cameras 106 and 108) which is in communication with computer 72 and preferably located, as shown, in close proximity to optics and scan controller (including mirror 84) located above surface 90 of platform 80. Camera 104 may be any one of a number of commercially available cameras, such as capacitive-coupled discharge (CCD) cameras available from a number of vendors. Suitable circuitry as required for adapting the output of camera 104 for use by computer 72 may be incorporated in a board 100 installed in computer 72, which is programmed as known in the art to respond to images generated by camera 104 and processed by board 100. Camera 104 and board 100 may together comprise a so-called "machine vision system," and specifically a "pattern recognition system" (PRS), the operation of which will be described briefly below for a better understanding of the present invention. Alternatively, a self-contained machine vision system available from a commercial vendor of such equipment may be employed. For example, and without limitation, such systems are available from Cognex Corporation of Natick, Mass. For example, the apparatus of the Cognex BGA Inspection Package™ or the SMD Placement Guidance Package™ may be adapted to the present invention, although it is believed that the MVS-8000™ product family and the Checkpoint® product line, the latter employed in combination with Cognex PatMax™ software, may be especially suitable for use in the present invention.

It is noted that a variety of machine vision systems are in existence, examples of which and their various structures and uses are described, without limitation, in U.S. Pat. Nos. 4,526,646; 4,543,659; 4,736,437; 4,899,921; 5,059,559; 5,113,565; 5,145,099; 5,238,174; 5,463,227; 5,288,698; 5,471,310; 5,506,684; 5,516,023; 5,516,026; and 5,644,245. The disclosure of each of the immediately foregoing patents is hereby incorporated herein by this reference.

In order to facilitate practice of the present invention with apparatus 70, a data file representative of the size, configuration, thickness and surface topography of, for example, a particular type and design of substrate, such as a semiconductor flip-chip die 12 or wafer 20 including a plurality of dice 12, is placed in the memory of computer 72. If packaging material in the form of the aforementioned photopolymer is to be applied only to active surface 16 of die 12, or to active surface 16 and to backside 28 of die 12, a large plurality of such dice 12 in the form of a wafer 20, portions 20A of a wafer, singulated dice 12, or other substrates may be placed on surface 90 of platform 80 for packaging, as depicted in FIG. 10. Camera 104 is then activated to locate the position and orientation of each die 12, wafer 20, substrate 40, or other substrate to be packaged by scanning platform 80 and comparing the features of the die 12, wafer 20, substrate 40, or other substrate with those in the data file residing in memory, the locational and any orientational data for each substrate including data relating to the locations of any conductive structures 18 then also being stored in memory. It should be noted that the data file representing the design size, shape and topography for the die 12, wafer 20, substrate 40, or other substrate may be used at this juncture to detect physically defective or damaged substrates prior to stereolithography packaging and to automatically delete such substrates, such as following singulation of such substrates from other substrates (e.g., of die 12 from wafer 20). It should also be noted that data files for more than one type (size, thickness, configuration, surface topography) of substrate may be placed in computer memory and computer 72 programmed to recognize not only substrate locations and orientations, but which type of substrate is at each location so that material 76 may be cured by laser beam 88 in the correct pattern and to the height required to define the structure (e.g., layer 30, 34, or 50) being fabricated.

In the present invention, when dice 12 are being packaged, it is preferred that all or nearly all of the device fabrication steps are conducted at the wafer level, avoiding a great deal of individual die handling and packaging. Furthermore, the packaging formed in accordance with teachings of the present invention includes preplaced protection, supporting, or sealing structures which can form substantially hermetic seals upon bonding the packaged die 12, substrate 40, or other substrate to a second substrate. The method of the invention is also useful for providing a package structure which seals the active surface of a substrate as well as at least partially laterally sealing any conductive structures secured to the contact pads of the substrate.

The photopolymer material 76 selected for use in this invention may be any polymer that exhibits appropriate polymerization properties, has a desirable dielectric constant, has low shrinkage upon cure, is of sufficient (i.e., semiconductor grade) purity, exhibits good adherence to other semiconductor device materials, has sufficient strength to withstand mishandling, and which is of sufficiently similar coefficient of thermal expansion (CTE) so that the polymer structure (i.e., package) and the die itself are not stressed during thermal cycling in testing and subsequent normal operation. Exemplary photopolymers exhibiting these properties are believed to include, but are not limited to, the above-referenced resins from Ciba Specialty Chemical Company. One area of particular concern in determining resin suitability is the substantial absence of mobile ions, specifically fluorides.

It is notable that the method of the present invention, in addition to eliminating the capital equipment expense of transfer molding processes, is extremely frugal in its use of dielectric encapsulant material 76, since all such material in which cure is not initiated by laser 82 remains in a liquid state in reservoir 74 for use in treating the next wafer, die or substrate.

Further, the high precision of the stereolithography process results in flip-chip devices 10 which are of enhanced quality and uniformity. Surprisingly, the package dimensional tolerances achievable through use of the present invention are more precise, e.g., three times more precise, than those of which a transfer molding system is capable, and there is no need for an inclined mold sidewall (and thus extra packaging material) to provide a release angle to facilitate removal of a packaged die from a mold cavity. Moreover, there is no potential for mold damage or wear, or requirement for mold refurbishment. Finally, the extended cure times at elevated temperatures, on the order of about four hours at 175 degrees C, required after removal of batches of dice from the transfer mold cavities, are eliminated. Postcure of die packages formed according to the present invention may be effected with broad-source UV radiation emanating from, for example, flood lights in a chamber through which dice are moved on a conveyor, or in large batches. Additionally, at least partially uncured photopolymer in shadowed spaces 56 of layers 30, 34, or 50 adjacent conductive structures 18 may be substantially fully cured, or cross-linked in an oven at a relatively low temperature such as, for example, 160 degrees C.

It should also be noted that the packaging method of the present invention is conducted at substantially ambient temperature, the small beam spot size 102 (FIG. 10) and rapid traverse of laser beam 88 around and over wafer 20, die 12, substrate 40, or another substrate resulting in negligible thermal stress thereon.

While the present invention has been disclosed in terms of certain preferred embodiments, those of ordinary skill in the art will recognize and appreciate that the invention is not so limited. Additions, deletions and modifications to the disclosed embodiments may be effected without departing from the scope of the invention as claimed herein. Similarly, features from one embodiment may be combined with those of another while remaining within the scope of the invention.

What is claimed is:

1. A method for packaging at least one semiconductor device, comprising:

providing at least one semiconductor device with at least one contact pad exposed at a surface thereof;

forming a layer comprising liquid photopolymer on said surface; and subjecting at least one region of said layer to radiation to at least partially polymerize photopolymer in said at least one region.

2. The method of claim 1, wherein said subjecting comprises adhering said photopolymer to said surface.

3. The method of claim 1, wherein, following said subjecting, said forming and said subjecting are sequentially repeated at least one time to form a polymeric structure having a plurality of superimposed, contiguous, mutually adhered layers on said surface.

4. The method of claim 3, wherein said forming and said subjecting form a polymeric structure with a substantially planar surface.

5. The method of claim 1, wherein said subjecting comprises subjecting at least a region of said layer that will comprise an outer periphery of a package structure.

6. The method of claim 1, further comprising:

further polymerizing photopolymer of at least one of said at least one region and uncured photopolymer.

7. The method of claim 6, wherein said further polymerizing comprises heating said photopolymer.

8. The method of claim 6, wherein said further polymerizing comprises only partially polymerizing said photopolymer.

9. The method of claim 1, wherein said subjecting comprises stereolithography.

10. The method of claim 1, further comprising:

providing another layer of photopolymer on a backside of said at least one semiconductor device; and subjecting at least one region of said another layer to radiation to polymerize photopolymer in said at least one region.

11. The method of claim 10, further comprising:

further polymerizing said at least one region of said another layer.

12. The method of claim 1, wherein said forming comprises permitting said photopolymer to contact recessed areas on said surface.

13. The method of claim 1, wherein said providing said at least one semiconductor device comprises providing a semiconductor wafer.

14. The method of claim 1, further comprising securing at least one conductive structure to said at least one contact pad.

15. The method of claim 1, wherein said subjecting comprises subjecting said photopolymer to a focused laser beam.

16. A method for forming sealed electrical connections between at least one flip-chip type semiconductor device and a carrier substrate, comprising:

providing at least one semiconductor device comprising at least one bond pad-bearing surface;

forming at least one layer comprising at least semisolid material on said at least one bond pad-bearing surface with at least one bond pad of said at least one semiconductor device being electrically exposed therethrough;

providing a carrier substrate comprising at least one contact pad located correspondingly to said at least one bond pad;

forming a layer comprising polymeric material on said surface of said carrier substrate with said at least one contact pad being electrically exposed therethrough;

securing at least one conductive structure to at least one of said at least one bond pad and said at least one contact pad;

aligning said at least one bond pad and said at least one contact pad; and connecting said at least one conductive structure between said at least one bond pad and said at least one contact pad.

17. The method of claim 16, further comprising securing said at least one layer on said at least one semiconductor device and said layer on said carrier substrate to one another.

18. The method of claim 17, wherein said securing said layers comprises further curing said at least semisolid polymeric material of said at least one layer on said at least one semiconductor device.

19. The method of claim 16, wherein said connecting comprises reflowing said at least one conductive structure.

20. The method of claim 16, wherein said securing comprises placing at least one conductive structure comprising z-axis conductive elastomer in contact with said at least one bond pad and with said at least one contact pad.

21. The method of claim 16, wherein said securing comprises placing at least one conductive structure comprising a conductive or conductor-filled epoxy between said at least one bond pad and said at least one contact pad.

22. The method of claim 16, wherein said forming said at least one layer comprising at least semisolid material comprises:

forming a layer comprising liquid photopolymer on said at least one semiconductor device;

subjecting at least one region of said layer to radiation, whereby said liquid photopolymer is converted to an at least semisolid state; and repeating said forming and said subjecting to form at least one additional layer comprising photopolymer.

23. The method of claim 22, wherein said subjecting comprises subjecting said at least one region of said at least one layer to a focused laser beam.

24. The method of claim 16, wherein said forming said at least one layer comprising at least semisolid material is effected by stereolithography.

25. The method of claim 16, wherein said forming said layer comprising polymeric material is effected by stereolithography.

26. The method of claim 16, further comprising:

forming a layer of polymeric material on a backside of said at least one semiconductor device.

27. The method of claim 26, wherein said forming said layer of polymeric material on said backside comprises:

providing a layer comprising liquid photopolymer on said backside; and selectively polymerizing said layer comprising liquid photopolymer.

28. The method of claim 16, wherein said providing said at least one semiconductor device comprises providing a wafer with a plurality of semiconductor devices thereon.

29. A method for simultaneously packaging a plurality of semiconductor devices, comprising:

providing a substrate comprising semiconductor devices fabricated thereon;

securing conductive structures to bond pads of at least some of said semiconductor devices;

recognizing a location and orientation of bond pads of at least some of said semiconductor devices; and stereolithographically forming protective structures comprising at least one semisolid layer over at least some of said semiconductor devices with said conductive structures extending through said protective structures.

30. The method of claim 29, wherein said stereolithographically forming comprises:

storing data including at least one physical parameter of each of said semiconductor devices in computer memory and using the stored data in conjunction with a machine vision system to recognize locations of said semiconductor devices and bond pads thereof; and using the stored data, in conjunction with the machine vision system, to selectively consolidate material of at least one layer over selected regions of selected semiconductor devices on said substrate.

31. A semiconductor device assembly comprising:

a first substrate comprising at least one first bond pad;

at least one first layer of at least semisolid photopolymer on a surface of said first substrate with said at least one first bond pad electrically exposed therethrough;

a second substrate comprising at least one second bond pad;

at least one second layer of at least semisolid photopolymer on a surface of said second substrate with said at least one second bond pad electrically exposed therethrough, said at least one first bond pad and said at least one second bond pad being correspondingly positioned, said at least one first layer and said at least one second layer contacting one another; and at least one conductive structure communicating with said at least one first bond pad and said at least one second bond pad.

32. The semiconductor device assembly of claim 31, wherein said at least one first layer and said at least one second layer are secured to one another.

33. The semiconductor device assembly of claim 31, wherein said at least semisolid photopolymer of said at least one first layer and said at least semisolid photopolymer of said at least one second layer are substantially solid.

34. The semiconductor device assembly of claim 31, wherein said at least one conductive structure is laterally surrounded by photopolymer material.

35. The semiconductor device assembly of claim 31, wherein said at least one first layer and said at least one second layer are substantially free of internal voids.

36. A packaged semiconductor device, comprising:

a semiconductor device; and a plurality of layers of at least semisolid photopolymer on at least an active surface of said semiconductor device, said plurality of layers being at least partially superimposed, contiguous, and mutually adhered, at least one bond pad of said semiconductor device being electrically exposed through said plurality of layers.

37. The packaged semiconductor device of claim 36, further comprising:

at least one conductive structure contacting with said at least one contact pad, said at least one conductive structure being laterally surrounded by said at least semisolid photopolymer material of at least some layers of said plurality of layers.

38. The packaged semiconductor device of claim 37, wherein said at least semisolid photopolymer laterally contacts said at least one conductive structure.

39. The packaged semiconductor device of claim 37, wherein said at least one conductive structure comprises one of a metal, a metal alloy, a conductive epoxy, a conductor-filled epoxy, and a z-axis elastomer.

40. The packaged semiconductor device of claim 36, wherein said semiconductor device comprises a flip-chip type semiconductor device.

* * * * *

UNITED STATES PATENT AND TRADEMARK OFFICE

CERTIFICATE OF CORRECTION

PATENT NO. : 6,544,821 B2
DATED : April 8, 2003
INVENTOR(S) : Salman Akram

It is certified that error appears in the above-identified patent and that said Letters Patent is hereby corrected as shown below:

Column 4,
Line 40, change "if" to -- If --

Signed and Sealed this

Eighth Day of July, 2003

JAMES E. ROGAN
*Director of the United States Patent and Trademark Office*